United States Patent [19]

Smith

[11] 4,069,054

[45] Jan. 17, 1978

[54] PHOTOPOLYMERIZABLE COMPOSITION CONTAINING A SENSITIZED AROMATIC SULFONIUM COMPOUND AND A CATIONACALLY POLYMERIZABLE MONOMER

[75] Inventor: George H. Smith, Maplewood, Minn.

[73] Assignee: Minnesota Mining and Manufacturing Company, St. Paul, Minn.

[21] Appl. No.: 609,896

[22] Filed: Sept. 2, 1975

[51] Int. Cl.$^2$ .................................................. G03C 1/68
[52] U.S. Cl. .................................... 96/115 P; 96/88
[58] Field of Search ................ 96/75, 115 P, 88, 90 R

[56] References Cited

U.S. PATENT DOCUMENTS

| | | | |
|---|---|---|---|
| 3,567,453 | 3/1971 | Borden | 96/75 |
| 3,640,718 | 2/1972 | Smith | 96/88 |
| 3,808,006 | 4/1974 | Smith | 96/115 P |

*Primary Examiner*—Won H. Louie, Jr.
*Attorney, Agent, or Firm*—Cruzan Alexander; Donald M. Sell; Dean P. Edmundson

[57] ABSTRACT

Aromatic sulfonium compounds are sensitized to longer wavelengths of light by means of aromatic tertiary amines, aromatic tertiary diamines and certain aromatic polycyclic compounds.

3 Claims, No Drawings

PHOTOPOLYMERIZABLE COMPOSITION CONTAINING A SENSITIZED AROMATIC SULFONIUM COMPOUND AND A CATIONACALLY POLYMERIZABLE MONOMER

BACKGROUND OF THE INVENTION

This invention relates to sulfonium compounds and, more particularly, to photosensitization of aromatic sulfonium compounds.

Sulfonium salts are known to absorb ultraviolet light only at wavelengths below about 300 nm, and their absorption spectra is essentially independent of the anion portion of the molecule. This limited spectral response is accordingly a serious inherent limitation with respect to their use as photoinitiators in photosensitive compositions. For example, in the field of graphic arts, such as in the preparation of printing plates, a photographic film negative is disposed between the lamp and the photosensitive plate. This film negative, however, prevents the transmission of appreciable light of wavelengths below about 340 nm. Furthermore, when photosensitive compositions are used as photocurable coatings, light of wavelengths below about 300 nm. decreases in intensity as it passes through the coating, due to absorption of the light by the monomeric compounds, binders, etc., present in the coating.

Although there are dozens of known classes of dyes and other materials which can be used to broaden the spectral response of photosensitive compositions, it has not been possible to predict which materials would be useful in sensitizing aromatic sulfonium salts. In fact, it has been found that only select materials are useful in sensitizing aromatic sulfonium salts. For example, a well known and widely used class of energy transfer sensitizers, known as triplet sensitizers, e.g., benzophenone, acetophenone, etc., are not significantly effective for sensitizing aromatic sulfonium salts.

SUMMARY OF THE INVENTION

In accordance with the present invention there is provided a photosensitive admixture comprising an aromatic sulfonium compound and a sensitizing compound selected from the group consisting of:

a. aromatic tertiary amines having the formula

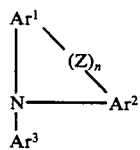

where $Ar^1$, $Ar^2$ and $Ar^3$ are aromatic groups having 6 to 20 carbon atoms; Z is selected from oxygen; sulfur;

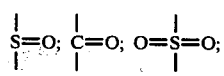

a carbon-to-carbon bond; or

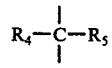

where $R_4$ and $R_5$ are selected from hydrogen, alkyl radicals of 1 to 4 carbons, and alkenyl radicals of 2 to 4 carbons, and wherein $n$ is zero or 1;

b. aromatic tertiary diamines having the formula

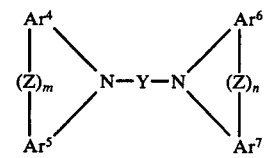

where Y is a divalent radical selected from arylene and $Ar^8$—Z—$Ar^9$, where Z is as described above; $Ar^4$, $Ar^5$, $Ar^6$, $Ar^7$, $Ar^8$ and $Ar^9$ are aromatic groups having 6 to 20 carbon atoms; and wherein $n$ and $m$ are zero or 1; and c. aromatic polycyclic compounds having at least three fused benzene rings and further having an ionization energy less than about 7.5 ev.

There are many advantages associated with sensitized aromatic sulfonium compounds. For example, in photosensitive compositions the speed of light curing is increased, and safer and less expensive exposure lamps may be used effectively.

DETAILED DESCRIPTION OF THE INVENTION

Aromatic sulfonium compounds which can be sensitized in accordance with this invention include those having the formula

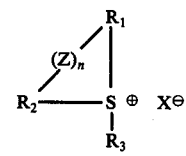

wherein $R_1$, $R_2$ and $R_3$ can be the same or different, provided that at least one of such groups is aromatic, and such groups can be selected from aromatic groups having 4 to 20 carbon atoms (e.g., substituted and unsubstituted phenyl, thienyl, and furanyl) and alkyl radicals having 1 to 20 carbon atoms. The term "alkyl" as used here is meant to include substituted alkyl radicals (for example, substituents such as halogen, hydroxy, alkoxy, aryl). Preferably, $R_1$, $R_2$ and $R_3$ are each aromatic. Z is selected from the group consisting of oxygen; sulfur;

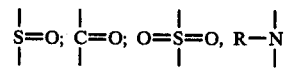

where R is aryl (of 6 to 20 carbons, such as phenyl) or acyl (of 2 to 20 carbons, such as acetyl, benzoyl, etc.); a carbon-to-carbon bond; or

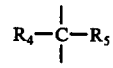

where $R_4$ and $R_5$ are selected from the group consisting of hydrogen, an alkyl radical having 1 to 4 carbon atoms, and an alkenyl radical having 2 to 4 carbon atoms; and $n$ is zero or 1; and $X^-$ is an anion. Although, the particular nature of the anion, X, is not limiting or critical for the purposes of this invention (i.e., for the purposes of sensitizing the sulfonium cation), for many applications it is preferred for the aromatic sulfonium compound to be in the form of a complex salt where X is selected from tetrafluoroborate, hexafluorophosphate, hexafluoroarsenate, and hexafluoroantimonate.

Aromatic sulfonium salts are known and recognized in the art. Triaryl-substituted sulfonium compounds, for example, can be prepared by the procedures described in G. H. Wiegand, et al., Snythesis and Reactions of Triarylsulfonium Halides, J. Org. Chem. 33, 2671–75 (1968). Aromatic sulfonium salts also having alkyl-substitution can be prepared by the procedures described in K. Ohkubo et al., J. Org. Chem. 36, 3149–55 (1971). The preferred method for making triaryl-substituted sulfonium compounds is described in U.S. Pat. No. 2,807,648, incorporated herein by reference, from which complex sulfonium salts can be made. The complex sulfonium salts can be prepared from the corresponding simple salts, such as the halide salts, by metathesis with a metal or ammonium salt of the complex anion desired.

The sulfonium complex salts are substituted with at least one, and preferably three, aromatic groups. Representative groups are aromatic groups having 4 to 20 carbon atoms and are selected from phenyl, thienyl and furanyl groups. These aromatic groups may optionally have one or more fused benzo rings (e.g., naphthyl and the like; benzothienyl, dibenzothienyl; benzofuranyl, dibenzofuranyl; etc.). Such aromatic groups may also be substituted, if desired, by one or more of the following groups, or by other groups which are essentially non-reactive with other components present in the particular composition in which the complex salt is to be used: halogen, nitro, aryl, ester groups (e.g., alkoxycarbonyl such as methoxycarbonyl and ethoxycarbonyl, phenoxycarbonyl and acyloxy such as acetoxy and propionyloxy), sulfo ester groups (e.g., alkoxysulfonyl such as methoxysulfonyl and butoxysulfonyl, phenoxysulfonyl, and the like), amido groups (e.g., acetamido, butyramido, ethylsulfonamido, and the like), carbamyl groups (e.g., carbamyl, N-alkylcarbamyl, N-phenylcarbamyl, and the like), sulfamyl groups (e.g., sulfamyl, N-alkylsulfamyl, N,N-dialkysulfamyl, N-phenylsulfamyl, and the like), alkoxy groups (e.g., methoxy, ethoxy, butoxy, and the like), aryl groups (e.g., phenyl), alkyl groups (e.g., methyl, ethyl, butyl, and the like) aryloxy groups (e.g., phenoxy), alkylsulfonyl (e.g., methylsulfonyl, ethylsulfonyl, and the like), arylsulfonyl groups (e.g., phenylsulfonyl groups), perfluoroalkyl groups (e.g., trifluoromethyl, perfluoroethyl, and the like), and perfluoroalkylsulfonyl groups (e.g., trifluoromethylsulfonyl, perfluorobutylsulfonyl, and the like).

Examples of suitable aromatic sulfonium complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluorantimonate
4-butoxyphenyldiphenylsulfonium tetrafluoroborate
4-chlorophenyldiphenylsulfonium hexafluoroantimonate
tris(4-phenoxyphenyl)sulfonium hexafluorophosphate
di(4-ethoxyphenyl)methylsulfonium hexafluoroarsenate
4-acetonylphenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynaphthyl)methylsulfonium tetrafluoroborate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
methyl(N-methylphenothiazinyl)sulfonium hexafluoroantimonate
phenylmethylbenzylsulfonium hexafluorophosphate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Of the aromatic sulfonium complex salts which are used in this invention the preferred salts are the triaryl-substituted salts such as triphenylsulfonium hexafluorophosphate. The triaryl-substituted salts are preferred because they are more thermally stable than the mono- and diaryl substituted salts and accordingly may be used in one-part curable systems where long shelf life is desired. The triaryl-substituted complex salts are also more amenable to dye sensitization in accordance with this invention.

Sensitizers useful in the practice of this invention are found in the following categories:

1. Aromatic tertiary amines having the formula

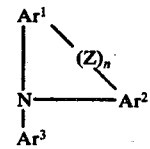

where $Ar^1$, $Ar^2$ and $Ar^3$ are aromatic groups having 6 to 20 carbon atoms and may be the same or different. The aromatic groups may be substituted, if desired, with groups or radicals such as hydroxyl, alkoxy, acyl or alkyl. Z may be oxygen; sulfur;

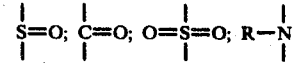

where R is aryl (of 6 to 20 carbons, such as phenyl, naphthyl, etc.); a carbon-to-carbon bond; or

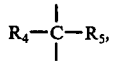

where $R_4$ and $R_5$ are selected from hydrogen, alkyl radicals of 1 to 4 carbons, and alkenyl radicals of 2 to 4 carbons, and wherein $n$ is zero or 1.

2. Aromatic tertiary diamines having the formula

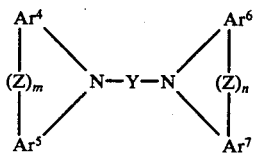

where $Y$ is a divalent radical selected from arylene and $Ar^8-Z-Ar^9$, where Z is as described above for aromatic tertiary amines; $Ar^4$, $Ar^5$, $Ar^6$, $Ar^7$, $Ar^8$ and $Ar^9$ are aromatic groups having 6 to 20 carbon atoms and may be the same or different; and $m$ and $n$ are zero or 1. The aromatic groups may be substituted, if desired, with groups or radicals such as hydroxyl, alkoxy, acyl or alkyl.

3. Aromatic polycyclic compounds having at least three fused benzene rings and having an ionization energy less than about 7.5 ev., as calculated by the method of F. A. Matsen, *J. Chem. Physics,* 24, 602 (1956), incorporated herein by reference. The compounds may be substituted, if desired, with alkyl, alkoxy, aryl, aryloxy, aralkyl, alkaryl, etc.

Representative sensitizers coming within the above useful classes include:
triphenylamine
dinaphthylphenylamine
N,N-diphenyl-N-p-methoxyphenylamine
9-(N,N-diphenylamino)-anthracene
N,N,N',N'-tetraphenyl-p-phenylenediamine
N,N,N',N'-tetraphenylbenzidine
N-phenylphenothiazine
N-phenylphenoxazine N,N'-diphenyldibenzopiperazine
N-phenyl-9,10-dihydroacridine
N-naphthylacridone
4,4'-diphenylaminodiphenylether
anthracene
2-ethyl-9,10-dimethoxyanthracene
9-methylanthracene
9,10-dimethylanthracene
1,2-benzanthracene
perylene
rubrene
tetraphenylpyrene
9,10-diphenylanthracene
tetracene
pentacene
anthanthrene Generally speaking, the sensitized aromatic sulfonium complex salts are primarily useful as photoinitiators for cationic reactions (such as polymerization of cationically polymerizable monomers). For example, the sensitived complex salts are particularly suitable as photoinitiators for the polymerization or copolymerization of epoxides, oxetanes, vinyl ethers, lactones, etc. The sensitized complex salts are also useful as photoinitiators for free-radical polymerization (e.g., polymerization of vinyl monomers).

Generally speaking, the amount of sensitizer used in the practice of this invention is about 0.01 to 1 part, and preferably about 0.1 to 1 part, by weight of sensitizer per part of aromatic complex salt. Factors to consider in determining the amount of sensitizer to be included in a given composition include intended light exposure conditions, thickness of the composition to be cured, solubility of the sensitizer in the composition, and other factors normally considered in the utilization of sensitizers.

The invention is further illustrated by means of the following non-limiting examples wherein the term "parts" refers to parts by weight unless otherwise indicated.

The terms "DER-331" and "Epon 828" refer to commercially available epoxy resins of the aromatic glycidyl either type having an epoxide equivalent weight of approximately 185. The term "Grantrez HY-H" refers to commercially available poly(methylvinylether/maleic acid) copolymer useful as a binder resin.

EXAMPLES 1-11

A master solution of the following materials was prepared:
100 g. "DER-331"
4 g. $\phi_3 S\ PF_6$
10 g. acetone 20 mg. of each of the materials in Table I were dissolved in each of 5 g. samples of the master solution and knife coated at a 50 microns thickness (wet) on a polyester film and then dried. Samples of the coatings were exposed through a Corning filter that passed only light of wave lengths greater than 334 nm. The exposure lamp was a GE H3T7 high pressure mercury lamp and the distance was 7 inches. The exposure time to produce a surface that was tack free was determined as well as the exposure time needed to produce complete cure. The times are recorded in Table I along with results from a control sample.

Table I

| Ex. No. | Sensitizing Dye | Surface Tack Free | Top & Bottom Tack Free |
|---|---|---|---|
| 1 | 2-ethyl-9,10-dimethoxyanthracene | 15 sec. | 60 sec. |
| 2 | perylene | 45 sec. | 2.5 min. |
| 3 | 9-methylanthracene | 30 sec. | 2.5 min. |
| 4 | 9,10-dimethylanthracene | 30 sec. | 90 sec. |
| 5 | tetraphenylpyrene | 30 sec. | 3.5 min. |
| 6 | anthracene | 25 sec. | 50 sec. |
| 7 | rubrene | 2 min. | 3.5 min. |
| 8 | N-phenyl phenothiazine | 2 min. | 2 min. |
| 9 | N,N,N',N'-tetraphenyl-phenylenediamine | 75 sec. | 75 sec. |
| 10 | N,N,N',N'-tetraphenyl benzidine | 45 sec. | 60 sec. |
| 11 | None | >5 min. | >10 min. |

EXAMPLES 12-15

A master solution of the following materials was prepared:
50 g. of "Gantrez HY-H" solution (10% in methanol)
7 g. of diacetoneacrylamide
1 g. of methylene bis acrylamide
0.5 g. of $\phi_3 S^+ PF_6^-$ 10 mg. of the sensitizers in Table II were added to 5 g. of this master solution and knife coated on gelatin subbed polyester film at 50 microns wet thickness. Dried samples were exposed through a photographic step tablet under the lamp and at the distance described in Examples 1-11. The exposed samples were sprayed with water to dissolve away the unpolymerized areas. The number of insolubilized steps is an indication of the relative speed of photopolymerization.

Table II

| Ex. | Sensitizer | Exp. Time | Steps Polym. |
|---|---|---|---|
| 12 | None | >10 min. | 0 |
| 13 | 2-ethyl-9,10-dimethoxyanthracene | 3 min. | 3 |
| 14 | 9,10-dimethylanthracene | 3 min. | 1 |
| 15 | Triphenylamine | 3 min. | 1 |

EXAMPLES 16–18

A master solution of the following materials was prepared:
30 g. "DER-331"
1.2 g. Tri-p-tolylsulfonium hexafluoroantimonate
3 g. Acetone 20 mg. of the sensitizers in Table III were added to 5 g. of this master solution and knife coated on a polyester film at 50 microns wet thickness and air dried. Samples of the coatings were exposed through the same filter as described in Examples 1–11 but the exposure lamp was a 275 w General Electric sunlamp and the distance was 5 inches. The exposure time to produce a complete cure was determined and recorded in Table III.

Table III

| Example No. | Sensitizer | Exp. Time |
|---|---|---|
| 16 | 2-ethyl-9,10-dimethoxyanthracene | 30 sec. |
| 17 | N,N,N',N'-tetraphenylbenzidine | 45 sec. |
| 18 | 9-methylanthracene | 60 sec. |

EXAMPLES 19–24

A master solution of the following materials was prepared:
50 g. "DER-334"
2 g. $\phi_2 S^+ CH_3 PF_6$ 20 mg. of each of the sensitizers in Table IV dissolved in 5 g. samples of the master solution. These solutions were then knife coated at a wet thickness of 50 microns on a polyester film and air dried. Samples were exposed through the same filter as described in Examples 1–11. The exposure was made with a 275 w General Electric sunlamp at a distance of 5 inches. The exposure time required to produce a tack-free surface was determined and recorded in Table IV.

Table IV

| Ex. No. | Sensitizer | Exp. Time |
|---|---|---|
| 19 | None | >6 min. |
| 20 | 9-(N,N-diphenylamino)anthracene | 3 min. |
| 21 | Tetraphenylpyrene | 3 min. |
| 22 | 2-t-butyl-9,10-dimethoxyanthracene | 3 min. |
| 23 | 1,2-benzanthracene | 2 min. |
| 24 | N,N,N',N'-tetraphenyl-p-phenylenediamine | 1 min. |

EXAMPLES 25–27

Photopolymerizable coating compositions were prepared from the ingredients listed in Table V where the relative amounts by weight are given. These compositions were then knife coated at 2 mils (50 microns) wet thickness onto a 2 mils (50 microns) thick polyester film and then air dried for 1 hour to give a 1.4 mils (35 microns) thick final film thickness.

Table V

| Example No. | 25 | 26 | 27 |
|---|---|---|---|
| "Epon 828" (epoxide) | 5 | 5 | 5 |
| Acetone | 1 | 1 | 1 |
| $\phi_3 SPF_6$ | 0.2 | 0.2 | 0.2 |
| Tetraphenylbenzidine | — | 0.02 | — |
| Perylene | — | — | 0.01 |

Samples of each coating were then exposed to a General Electric ® H3T7 mercury vapor lamp at a distance of 7 inches with a Corning Glass ® Filter Number 0-52 (the same filter as used in Examples 1–11) placed between each sample and the mercury lamp. This filter transmits less than 0.5% of light of wavelengths below 334 nm. The aromatic sulfonium complex salts absorb only light of wavelengths below about 320 nm; therefore, the filter effectively blocks the activating light necessary to photolyze the complex sulfonium salt. An exposure time of 10 minutes did not cause the sample of Example 25 to exhibit any photocuring. Exposure times of one minute and 2.5 minutes caused complete cures from top to bottom of the samples of Examples 26 and 27, respectively.

EXAMPLES 28–30

Photopolymerizable coating compositions were prepared from the ingredients listed in Table VI where the relative amounts by weight are given. These compositions were then knife coated at 3 mils (75 microns) wet thickness onto a gelatin subbed polyester film and then air dried 1 hour.

Table VI

| Example No. | 28 | 29 | 30 |
|---|---|---|---|
| "Gantrez HY-H" (10% in methanol | 5 | 5 | 5 |
| diacetoneacrylamide | 0.7 | 0.7 | 0.7 |
| methylenebisacrylamide | 0.1 | 0.1 | 0.1 |
| 2-ethyl-9,10-dimethoxyanthracene | — | 0.01 | 0.01 |
| triphenylsulfonium chloride | 0.05 | 0.05 | — |
| triphenylsulfonium tetrafluoroborate | — | — | 0.05 |

Samples of each of the coatings were exposed to a 275 w General Electric sunlamp at a distance of 5 inches with a Corning Glass ® Filter No. 0-52 placed between each sample and the lamp. Example 28 showed no evidence of photoinsolubilization after 5 minutes of exposure time. Examples 29 and 30 were insolubilized after only 5 seconds of exposure time.

What is claimed is:
1. A photopolymerizable composition comprising:
    a. a cationically polymerizable monomer;
    b. an aromatic sulfonium compound of the following forumula:

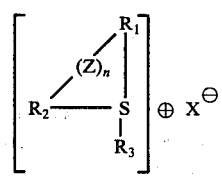

wherein $R_1$, $R_2$ and $R_3$ are selected from the group consisting of aryl groups having 4 to 20 carbon atoms and alkyl radicals having 1 to 20 carbon atoms; wherein at least one of $R_1$, $R_2$ and $R_3$ is aryl; wherein Z is selected from the group consisting of oxygen; sulfur;

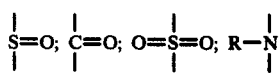

where R is aryl or acyl; a carbon-to-carbon bond; or

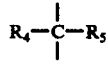

where $R_4$ and $R_5$ are selected from the group consisting of hydrogen, an alkyl radical having 1 to 4 carbon atoms, and an alkenyl radical having 2 to 4 carbon atoms; and $n$ is zero or 1; and $X-$ is a halogen-containing complex anion selected from tetrafluoroborate, hexafluorophosphate, hexafluoroarsenate, and hexafluoroantimonate; and c. a sensitizing compound selected from the group consisting of:
 i. aromatic tertiary amines having the formula

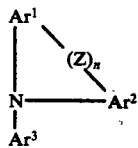

where $Ar^1$, $Ar^2$ and $Ar^3$ are groups having 6–20 carbon atoms; Z is selected from oxygen; sulfur;

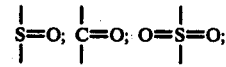

a carbon-to-carbon bond; or

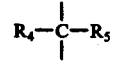

where $R_4$ and $R_5$ are selected from hydrogen, alkyl radicals of 1–4 carbons, and alkenyl radicals of 2–4 carbons, and wherein $n$ is zero or 1;
 ii. aromatic tertiary diamines having the formula

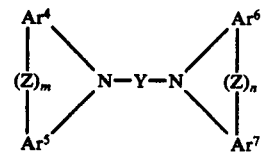

where Y is a divalent radical selected from arylene and $Ar^8-Z-Ar^9$, where Z is as described above; $Ar^4$, $Ar^5$, $Ar^6$, $Ar^7$, $Ar^8$ and $Ar^9$ are aryl groups having 6–20 carbon atoms; and wherein $n$ and $m$ are zero or 1; and
 iii. aryl polycyclic compounds having at least three fused benzene rings and further having an ionization energy less than about 7.5 ev.

2. A photopolymerizable composition in accordance with claim 1, wherein said monomer is an epoxide.

3. A photopolymerizable composition in accordance with claim 1, wherein said sensitizing compound is selected from 2-ethyl-9,10-dimethoxyanthracene, anthracene, rubrene, tetraphenylbenzidine, and triphenylamine.

* * * * *

UNITED STATES PATENT AND TRADEMARK OFFICE
CERTIFICATE OF CORRECTION

PATENT NO. : 4,069,054
DATED : January 17, 1978
INVENTOR(S) : George H. Smith

It is certified that error appears in the above-identified patent and that said Letters Patent are hereby corrected as shown below:

In the Title:

"CATIONACALLY" should read -- CATIONICALLY -- .

In the Claims:

(Claim 4) Col. 9, line 39, "where $Ar^1$, $Ar^2$ and $Ar^3$ are groups" should read -- where $Ar^1$, $Ar^2$ and $Ar^3$ are aryl groups -- .

Signed and Sealed this

Eleventh Day of July 1978

[SEAL]

Attest:

RUTH C. MASON
Attesting Officer

DONALD W. BANNER
Commissioner of Patents and Trademarks